United States Patent [19]

Harase et al.

[11] Patent Number: 5,032,921
[45] Date of Patent: Jul. 16, 1991

[54] DIGITAL STILL CAMERA

[75] Inventors: Toshikatsu Harase; Masahiko Mizuno, both of Tokyo, Japan

[73] Assignee: Fuji Photo Film Co., Ltd., Kanagawa, Japan

[21] Appl. No.: 404,026

[22] Filed: Sep. 7, 1989

[30] Foreign Application Priority Data

Sep. 19, 1988 [JP] Japan .................................. 63-232677

[51] Int. Cl.⁵ ............................................... H04N 5/30
[52] U.S. Cl. ..................................... 358/229; 358/909
[58] Field of Search ............... 358/229, 906, 909, 209, 358/335; 354/288 R, 288 A, 288 B, 288 C, 288 D, 288 E, 288 F, 288 H, 288 I, 288 M, 288 P, 288 V; 439/377

[56] References Cited

U.S. PATENT DOCUMENTS

| 3,369,470 | 2/1968 | Downey | D16/211 |
|---|---|---|---|
| 4,017,770 | 4/1977 | Valfre | 361/399 |
| 4,489,351 | 12/1984 | d'Alayer de Costemore d'Arc | 358/335 |
| 4,596,452 | 6/1986 | Ueda | 354/288 |
| 4,797,761 | 1/1989 | Cocco | 358/906 |
| 4,810,203 | 3/1989 | Komatsu | 439/326 |
| 4,837,628 | 6/1989 | Sasaki | 358/909 |
| 4,863,395 | 9/1989 | Babuka et al. | 439/260 |
| 4,887,161 | 12/1989 | Watanabe | 358/909 |

Primary Examiner—Howard W. Britton
Assistant Examiner—Safet Metjahic
Attorney, Agent, or Firm—Sughrue, Mion, Zinn, Macpeak & Seas

[57] ABSTRACT

A digital still camera using a memory cartridge as a storage medium. In the digital still camera, a connector, which is disposed on the side of the camera and into which the memory cartridge is inserted, is abutted against and supported by the inner wall surface of a camera chassis. Due to this, the digital still camera is sufficiently able to tolerate a load occurring when the memory cartridge is inserted, by means of the simplified structure thereof.

5 Claims, 2 Drawing Sheets

DIGITAL STILL CAMERA

BACKGROUND OF THE INVENTION

1. Field of the Invention

The present invention relates to a digital still camera and, in particular, to a digital still camera using a memory cartridge as a storage medium.

2. Description of the Related Art

Recently, there has been used a card-shaped memory device referred to as a memory cartridge or an IC card which includes a semiconductor memory and the like as an external storage medium for a digital still camera and also in which there are disposed a large number of terminals.

When such a card-shaped memory cartridge is inserted into a connector in the camera, there is required a large insertion force, which produces a great load on the mounting portion of the connector. In view of this, conventionally, in order to be able to tolerate the great load occurring when the memory cartridge is inserted, there is arranged a reinforcing member in the connector mounting portion of a foundation plate, or, alternatively, a portion of a camera chassis is formed in a projection shape and the connector is supported by the projection, so that the load can be received by the projection.

However, the above-mentioned connector mounting structure is disadvantageous in that the connector mounting portion is complicated.

Also, when the connector is coupled to the foundation plate, if the memory cartridge is inserted into the connector, then a shearing stress is applied to the connection portion between the foundation plate and connector, causing the connection portion to get out of place easily.

Also, in a conventional digital still camera, when the memory cartridge is inserted, the opposite end of the camera to the insertion side of the memory cartridge is projected out from the camera chassis. This means that the digital still camera is not compact.

SUMMARY OF THE INVENTION

The present invention aims at eliminating the drawbacks found in the above-mentioned prior art digital still camera.

Accordingly, it is an object of the invention to provide a compact digital still camera which is simple in structure and is able to sufficiently tolerate a load occurring when a memory cartridge is inserted.

Also, it is another object of the invention to provide a digital still camera in which no shearing stress is applied to the connection portion between a foundation plate and a connector when a memory cartridge is inserted.

In order to achieve the above object, according to the invention, there is provided a digital still camera in which a memory cartridge is used as a storage medium and the memory cartridge is inserted into the camera through a memory cartridge insertion opening formed in a camera chassis to be thereby connected to a connector, characterized in that a case for the connector is disposed to be in contact with the inner wall surface of the camera chassis so that the insertion force of the memory cartridge can be received by the camera chassis, and in that the camera chassis is constructed such that the opposite end face thereof to the memory cartridge insertion side is substantially the same with the surface of the memory cartridge insertion opening.

According to the invention, due to the fact the connector case is abutted and supported by the camera chassis, there is eliminated the need of provision of a reinforcing member to be provided separately, so that the connector supporting structure can be simplified. Also, due to the fact that, when the memory cartridge is inserted into the connector, the surface of the memory cartridge insertion opening in the camera chassis is substantially the same with the opposite end face to the memory cartridge insertion side, there can be provided a compact digital still camera.

BRIEF DESCRIPTION OF THE DRAWINGS

The exact nature of this invention, as well as other objects and advantages thereof, will be readily apparent from consideration of the following specification relating to the accompanying drawings in which like reference characters designate the same or similar parts throughout the figures thereof and wherein.

DETAILED DESCRIPTION OF THE INVENTION

Detailed description will hereunder be given of the preferred embodiment of a digital still camera according to the present invention with reference to the accompanying drawings.

Figure 1:
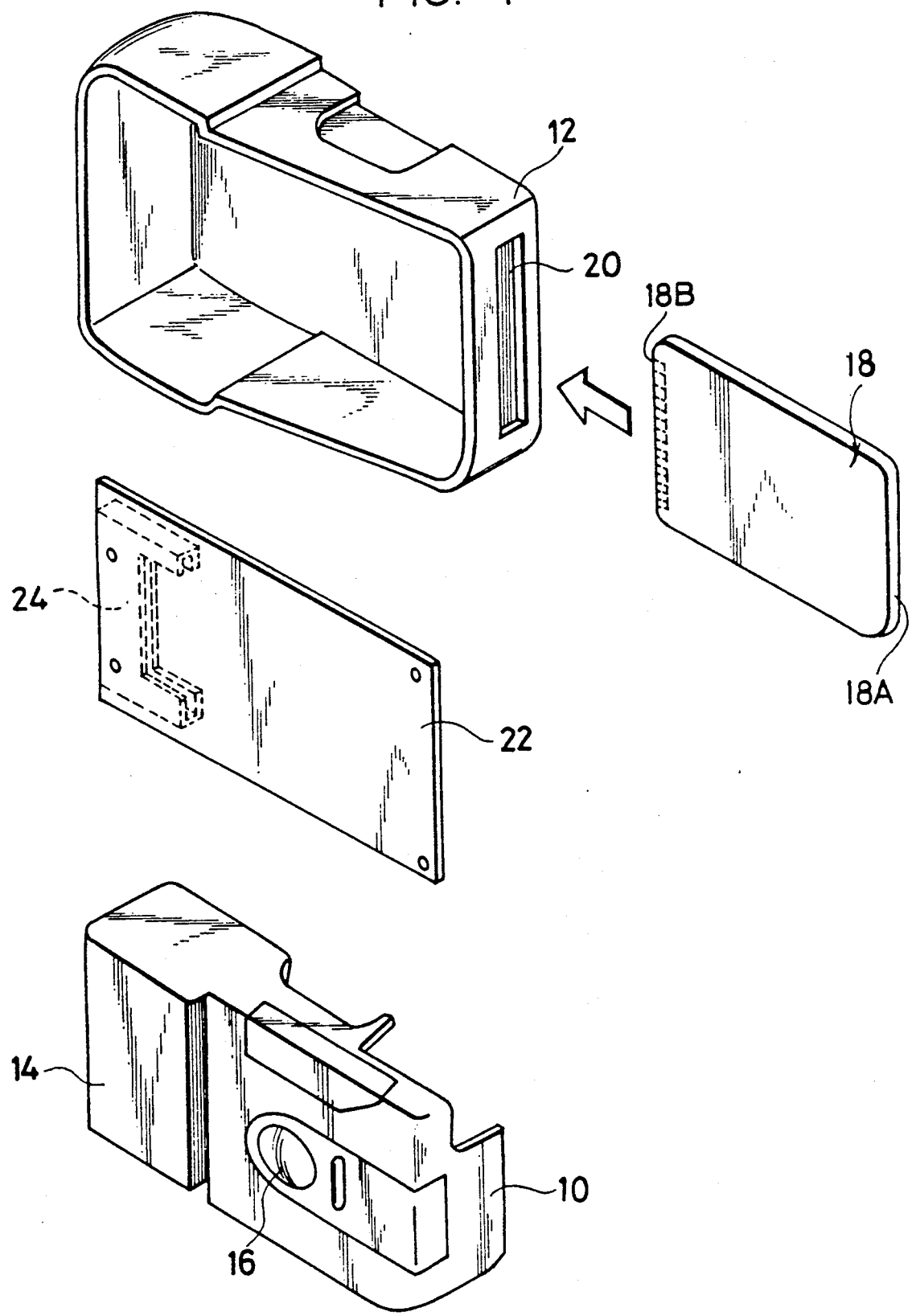
FIG. 1 is an exploded, perspective view of a digital still camera according to the invention.

Referring first to FIG. 1, there is shown an exploded perspective view of a digital still camera according to the invention. As shown in FIG. 1, the digital still camera has a chassis which comprises a front camera chassis 10 and a rear camera chassis 12. The front camera chassis 10 includes a grip portion 14, a taking lens 16 and the like, while the rear camera chassis is formed with a memory cartridge insertion opening 20 through which a memory cartridge 18 serving as an external storage medium is inserted into the interior of the camera. Within the camera chassis, there can be stored a control base plate 22 for memory cartridge.

Figure 2:
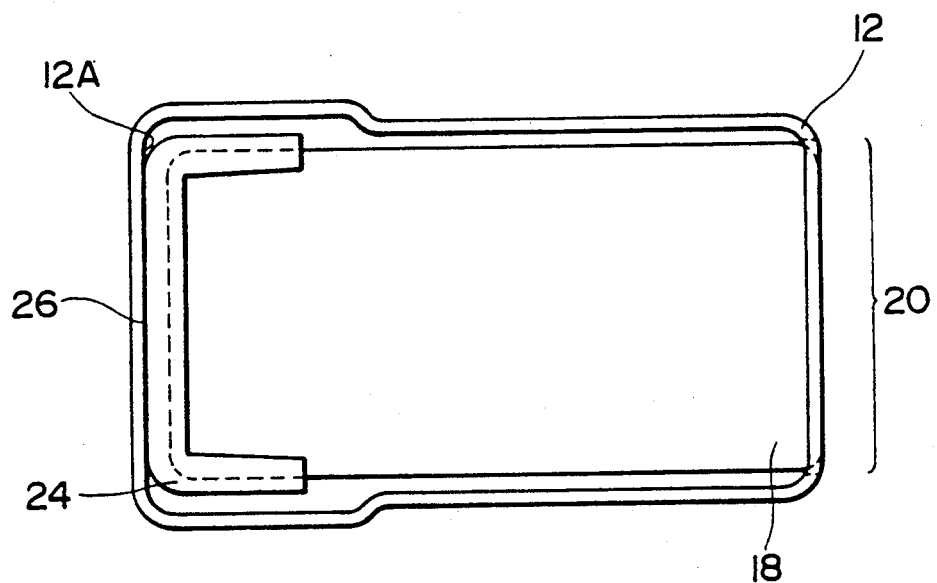
FIG. 2 is a front view of a memory cartridge storage portion of a digital still camera according to the invention; and, FIG. 3 is a side view of a digital still camera according to the invention.

A connector, designated by 24, is mounted to the memory cartridge control base plate 22. As shown in FIG. 2, the memory cartridge control base plate 22 is disposed in the camera chassis in such a manner that a case 26 for the connector 23 can be abutted against and supported by the inner wall surface 12A of the rear camera chassis 12. Also, the rear camera chassis 12 and front camera chassis 10 are constructed in such a manner that, when the memory cartridge 18 is inserted into the connector 24, the memory cartridge insertion opening 20 in the rear camera chassis 10 is substantially the same with an end face 18A of the memory cartridge disposed opposite to the insertion side of the memory cartridge 18.

According to the digital still camera constructed in the above-mentioned manner, when the end face 18B of the memory cartridge 18 is inserted into the connector 24, the load occurring in such insertion is supported by the inner wall surface 12A of the rear camera chassis 12. Also, due to the fact that, with the memory cartridge 18 inserted into the connector 24, the connector 24 is supported by the rear camera chassis 12, the memory cartridge insertion opening 20 is substantially flush with the end face of the memory cartridge to thereby reduce the width of the camera, so that a compact digital still camera can be realized.

Figure 3:
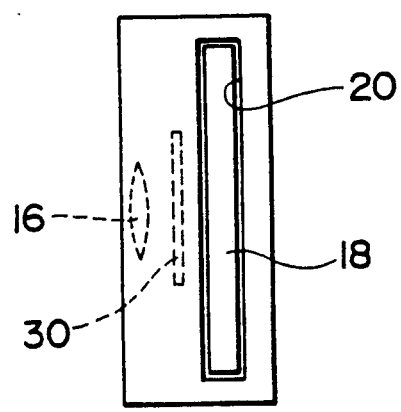

Also, the memory cartridge insertion opening 20 is preferably formed in the rear camera chassis 12, as in the above-mentioned embodiment. In particular, as shown in FIG. 3, in the rear of the taking lens 16, there are disposed a CCD 30 and the control base plate 22 (which is not shown in FIG. 3) and, therefore, the memory cartridge 18, which has a width substantially equal to that of the camera, must be disposed inevitably in the rear portion of the camera. Thus, the memory cartridge insertion opening 20 is preferably formed in the rear camera chassis 12.

Although in the illustrated embodiment the memory cartridge control base plate 22 and memory cartridge insertion opening 20 are respectively provided in the rear camera chassis 12, they may be provided in the front camera chassis 10.

As has been described hereinbefore, in the digital still camera according to the present invention, since the load applied to the connector when memory cartridge is inserted can be surely received by the camera chassis, there is eliminated the need for further provision of a reinforcing member required in the prior art digital still camera, whereby the structure of the present digital still camera can be simplified. Also, since the connector is disposed such that it can be by the camera chassis to thereby allow the memory cartridge insertion opening and memory cartridge end face to be flush with each other, a compact digital still camera can be supplied.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A digital still camera having a chassis with a cartridge connector therein and a memory cartridge insertion opening in which a memory cartridge, used as a storage medium, is inserted through said memory cartridge insertion opening and is thereby connected to said connector, comprising:

a case for said connector disposed in direct contact with the inner wall surface of said camera chassis that faces the memory cartridge insertion opening so that a force for insertion of said memory cartridge can be received by said camera chassis.

2. A digital still camera as set forth in claim 1, wherein said camera chassis is constructed in such a manner that, when said memory cartridge is inserted, the opposite end face of said memory cartridge to the insertion side thereof is substantially flush with the surface of said memory cartridge insertion opening in said camera chassis.

3. A digital still camera as set forth in claim 2, wherein said camera chassis comprises a front camera chassis and rear camera chassis.

4. A digital still camera as set forth in claim 3, wherein said memory cartridge insertion opening is formed in said rear camera chassis.

5. A digital still camera as set forth in claim 4, wherein said connector is disposed in a control base plate and said control base plate is mounted to said rear camera chassis so that said connector can be abutted against and supported by the inner wall surface of said rear camera chassis.

* * * * *